(12) United States Patent
Arendt et al.

(10) Patent No.: US 6,921,741 B2
(45) Date of Patent: Jul. 26, 2005

(54) SUBSTRATE STRUCTURE FOR GROWTH OF HIGHLY ORIENTED AND/OR EPITAXIAL LAYERS THEREON

(75) Inventors: Paul N. Arendt, Los Alamos, NM (US); Stephen R. Foltyn, Los Alamos, NM (US); James R. Groves, Los Alamos, NM (US); Quanxi Jia, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 162 days.

(21) Appl. No.: 10/359,808

(22) Filed: Feb. 7, 2003

(65) Prior Publication Data

US 2003/0144150 A1 Jul. 31, 2003

Related U.S. Application Data

(63) Continuation-in-part of application No. 09/731,534, filed on Dec. 6, 2000, now abandoned.

(51) Int. Cl.$^7$ ............................ B32B 19/00; B32B 9/00; H01L 39/00
(52) U.S. Cl. ....................... 505/239; 505/230; 505/237; 505/238; 428/701; 428/702
(58) Field of Search ............................... 505/100, 230, 505/236, 237, 238, 239, 813, 812; 428/697, 699, 701, 702, 930

(56) References Cited

U.S. PATENT DOCUMENTS

| | | | |
|---|---|---|---|
| 4,225,409 A | | 9/1980 | Minomura |
| 4,238,232 A | | 12/1980 | Minomura |
| 4,581,289 A | | 4/1986 | Dietrich et al. |
| 4,657,776 A | | 4/1987 | Dietrich et al. |
| 4,828,664 A | | 5/1989 | Dietrich et al. |
| 5,135,906 A | * | 8/1992 | Harada et al. ............... 505/237 |

(Continued)

FOREIGN PATENT DOCUMENTS

WO          WO 99/25908       *   5/1999

OTHER PUBLICATIONS

Groves et al., "Ion–beam Assisted Deposition of MgO with in situ RHEED Monitoring to Control Bi–axial Texture," HRS Symposium Proceedings, vol. 666, (2002), p. F10.6.1.

(Continued)

*Primary Examiner*—Colleen P. Cooke
(74) *Attorney, Agent, or Firm*—Bruce H. Cottrell

(57) ABSTRACT

A composite substrate structure including a substrate, a layer of a crystalline metal oxide or crystalline metal oxynitride material upon the substrate, a layer of an oriented cubic oxide material having a rock-salt-like structure upon the crystalline metal oxide or crystalline metal oxynitride material layer is provided together with additional layers such as one or more layers of a buffer material upon the oriented cubic oxide material layer.

$J_c$'s of $2.3\times10^6$ A/cm$^2$ have been demonstrated with projected $I_c$'s of 320 Amperes across a sample 1 cm wide for a superconducting article including a flexible polycrystalline metallic substrate, an inert oxide material layer upon the surface of the flexible polycrystalline metallic substrate, a layer of a crystalline metal oxide or crystalline metal oxynitride material upon the layer of the inert oxide material, a layer of an oriented cubic oxide material having a rock-salt-like structure upon the crystalline metal oxide or crystalline metal oxynitride material layer, a layer of a buffer material upon the oriented cubic oxide material layer, and, a top-layer of a high temperature superconducting material upon the layer of a buffer material.

27 Claims, 7 Drawing Sheets

| | |
|---|---|
| YBCO | 22 |
| ScRcO₃ | 20 |
| Homoepitaxial MgO | 18 |
| IBAD MgO | 16 |
| Y₂O₃ | 14 |
| Al₂O₃ | 12 |
| Ni alloy substrate | 10 |

U.S. PATENT DOCUMENTS

| | | | | |
|---|---|---|---|---|
| 5,252,551 A | * | 10/1993 | Wu et al. | 505/220 |
| 5,262,394 A | * | 11/1993 | Wu et al. | 505/237 |
| 5,278,138 A | * | 1/1994 | Ott et al. | 505/446 |
| 5,432,151 A | * | 7/1995 | Russo et al. | 505/474 |
| 5,527,766 A | | 6/1996 | Eddy | |
| 5,545,611 A | * | 8/1996 | Nakamura | 505/238 |
| 5,650,378 A | * | 7/1997 | Iijima et al. | 505/473 |
| 5,798,903 A | | 8/1998 | Dhote et al. | |
| 5,872,080 A | * | 2/1999 | Arendt et al. | 505/238 |
| 5,912,068 A | | 6/1999 | Jia | |
| 6,055,446 A | * | 4/2000 | Kroeger et al. | 505/230 |
| 6,060,433 A | * | 5/2000 | Li et al. | 505/473 |
| 6,190,752 B1 | | 2/2001 | Do et al. | |
| 6,251,834 B1 | * | 6/2001 | Glowacki et al. | 505/239 |
| 6,251,835 B1 | * | 6/2001 | Chu et al. | 505/411 |

OTHER PUBLICATIONS

Zepeda–Ruiz et al., "Effects of ion beams on the early stages of MgO growth," J. Appl. Phys., vol. 91, No. 12, Jun. 15, 2002, pp. 10169–10180.

Hühne et al., "Mechanism of Texture formation in MgO buffer Layers using ion–beam assisted laser deposition," Physica C 372–376 (2002), pp. 825–827.

Iijima et al., "Structural and transport properties of biaxially aligned $YBa_2Cu_3O_{7-x}$ films on polycrystalline Ni–based alloy with ion–beam–modified buffer layers," J. Appl. Phys. 74 (3), Aug. 1, 1993, pp. 1905–1911.

Hühne et al., "Formation and destruction of cube texture in MgO films using ion beam assisted pulsed laser deposition," J. Appl. Phys., vol. 90, No. 2, Jul. 15, 2001, pp. 1035–1039.

Dong, "Sputtering and in–plane texture control during the deposition of MgO," J. Appl. Phys., vol. 89, No. 7, Apr. 1, 2001, pp. 4105–4112.

Wang et al., "Deposition of in–plane textured MgO on amorphous $Si_3N_4$ substrates by ion–beam–assisted deposition and comparisons with on–beam–assisted deposited yttria–stabilized–zirconia," Appl. Phys. Lett. 71 (20), Nov. 17, 1997, pp. 2955–2957.

Hammond et al., "Ion–Assisted Deposition of Textured Thin Films on Low–Cost Substrates," Future Gen. Photovoltaic Tech., AIP Conf. Proceedings No. 404, (1997), pp. 157–162.

Hühne et al., "Real Time *In Situ* Texture Investigations of Thin Film Growth Using RHEED," Material Science Forum, vol. 408–412 (2002), pp. 1549–1554.

Hühne et al., "Growth of Biaxial Textured MgO–Layers by Ion–Beam Assisted Pulsed Laser Deposition," Cryst. Res. Technol. 35, 2000, 4, pp. 419–425.

Groves et al., "High Critical Current Density PLD YBCO Deposited On Highly textured IBAD MgO buffer layers," Ceramic Transactions, vol. 104, (2002), pp. 219–226.

Groves et al., "Recent progress in continuously processed IBADMgO template meters for HTS applications," Physica C 382 (2002), pp. 43–47.

Groves et al., "Improvement of IBAD MgO template layers on metallic substrates for YBCO HTS deposition," IEEE Transactions on Applied Superconductivity, vol. 13, Issue 2, Jun. 2003, pp. 2651–2654.

Groves et al., "High critical current density $YBa_2Cu_3O_{7-\delta}$ thick films using ion beam assisted deposition MgO bi–axially oriented template layers on nickel–based superalloy substrates," J. Mater. Res., vol. 16, No. 8, Aug. 2001, pp. 2175–2178.

Groves et al., "Ion–Beam Assisted Deposition of Bi–axially Aligned MgO Template Films for YBCO Coated Conductors," IEEE Transactions of Applied Superconductivity, vol. 9, No. 2, Jun. 1999, pp. 1964–1966.

Groves et al., "Texture Development in IBAD MgO Films as a Function of Deposition Thickness and Rate," IEEE Transactions on Applied Superconductivity, vol. 11, No. 1, Mar. 2001, pp. 2822–2825.

Groves et al., "Ultra–thin bi–axially textured IBAD MgO template layers resolved by grazing incidence X–ray diffraction," Physica C 355 (2001), pp. 293–298.

* cited by examiner

| YBCO | 22 |
| SrReO$_3$ | 20 |
| Homoepitaxial MgO | 18 |
| IBAD MgO | 16 |
| Y$_2$O$_3$ | 14 |
| Al$_2$O$_3$ | 12 |
| Ni alloy substrate | 10 |

Fig. 2

SUBSTRATE STRUCTURE FOR GROWTH OF HIGHLY ORIENTED AND/OR EPITAXIAL LAYERS THEREON

This application is a continuation-in-part of Ser. No. 09/731,534, filed Dec. 6, 2000 now abandoned, by Arendt et al.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to a composite substrate structure for subsequent growth of highly oriented and/or epitaxial layers thereon. For example, high temperature superconducting thick films can be grown epitaxially on such composite substrate structures with high $J_c$'s and $I_c$'s.

BACKGROUND OF THE INVENTION

The preparation of oriented layers of crystallographically materials is critical in a number of technical areas. For example, high temperature superconductors often employ epitaxially oriented layers of, e.g., YBCO to achieve desired properties. Similarly, epitaxially oriented films such as conductive oxides, ferroelectric, ferromagnetic, piezoelectric, insulating, and semiconductive materials are desired in the areas of microelectric and opto-electric devices. To achieve the desired crystallographic orientation, e.g., epitaxial orientation, of materials such as YBCO, $SrRuO_3$, PZT, $Ba_{1-x}Sr_xTiO_3$, $La_{0.7}Sr_{0.3}MnO_3$, and Si, extensive work has focused on the underlying structure or substrate onto which the oriented layers are deposited.

For example, the production of coated conductors (superconductive tapes or films) has been referred to as a thick film process involving superconductive layers generally of at least one micron in thickness. In such a thick film process, it has been shown that YBCO thin films deposited directly on single crystal substrates (such as $SrTiO_3$, $LaAlO_3$, $NdGaO_3$, yttria-stablized zirconia (YSZ), and MgO) can achieve critical current density ($J_c$) values of over $10^6$ amperes per square centimeter ($A/cm^2$) at 77 K. As large area single crystal substrates can be unavailable or prohibitively expensive, the use of polycrystalline substrates rather than single crystals has been desired. For amorphous or polycrystalline base substrates, the use of one or more suitable buffer layers to provide the necessary structural template for epitaxial growth of the superconducting layer was developed. For example, a YSZ buffer layer has been deposited by use of ion beam assisted deposition (IBAD) in which a YSZ layer is deposited in combination with irradiation from an ion beam directly on a deisred substrate during the deposition. Both Iijima et al., U.S. Pat. No. 5,650,378 and Russo et al., U.S. Pat. No. 5,432,151 have demonstrated deposition of in-plane textured YSZ buffer layers with IBAD, leading to YBCO thin films having excellent superconducting properties. Arendt et al., U.S. Pat. No. 5,872,080 described a coated conductor having the structure $YBCO/Y_2O_3/YSZ/Al_2O_3/Ni$ alloy with a high critical current density ($J_c$) of about $1 \times 10^6$ $A/cm^2$ and a high transport critical current ($I_c$) of from about 100 to about 200 A/cm. While the performance was satisfactory, the deposition of the YSZ layer was considered too slow for commercial production.

In U.S. Pat. No. 6,190,752 by Do et al., thin films of a material having a rock salt-like structure (e.g., MgO) were deposited by IBAD upon amorphous surfaces. In comparison to the deposition of YSZ, MgO with better in-plane texture can be rapidly deposited (about 100 times faster) through an IBAD process. The structures described by Do et al. included, e.g., $YBCO/Y_2O_3/YSZ/MgO/MgO(IBAD)/Si_3N_4/Ni$ alloy with a NiO layer in between the YSZ layer and the MgO layer in most instances. Despite the improvement in processing speeds, the resultant $J_c$'s were only from about 0.025 to about 0.33 $MA/cm^2$. A potential drawback in the use of such amorphous silicon nitride surfaces is that at the elevated processing temperatures needed to form the superconductive layer, silicon from the silicon nitride layer can migrate and react with other materials in the system. Additionally, Do et al. noted that the optimal thickness of their MgO layer likely corresponded to where the surface of the underlying substrate was fully covered by textured MgO crystallites and that with thicker depositions the texture begins to degrade. FIG. 1 shows a graph plotting the lattice tilt in degrees versus thickness of IBAD magnesium oxide upon an amorphous silicon nitride surface. It can be seen that the lattice tilt of IBAD magnesium oxide increases with increasing thickness.

Other groups have also taught the deposition of MgO upon amorphous substrates such as amorphous silicon nitride (Huhne et al., Materials Science Forum, vols. 408–412, pp. 1549–1554 (2002) and Groves et al., Physica C, vol. 382, pp. 43–47 (2002)), and oxidized silicon and Suprasil® fused silica (Huhne et al., Cryst. Res. Technol., vol. 35, pp. 419–425 (2000) and Huhne et al., Physica C, vol. 372–376, pp. 825–827 (2002)).

Further improvements in the structure and resultant properties of coated conductors have been sought. After extensive and careful investigation, applicants have found improvements in the preparation of composite substrate structures for subsequent growth of oriented layers thereon. The improvements have included the use of crystalline (e.g., nanocrystalline) materials upon which the MgO is deposited. Additionally, superconducting articles including such composite substrate structures have been developed.

It is an object of the present invention to provide composite substrate structures suitable for subsequent growth of oriented layers thereon.

Another object of the present invention is to provide composite substrate structures including flexible polycrystalline metallic substrates for subsequent deposition of, e.g. superconducting material such that resultant articles demonstrate desirable properties such as high $J_c$'s and $I_c$'s.

It is another object of the present invention to provide superconducting articles, especially superconducting articles including YBCO superconducting films.

SUMMARY OF THE INVENTION

To achieve the foregoing and other objects, and in accordance with the purposes of the present invention, as embodied and broadly described herein, the present invention provides a composite substrate structure including a substrate, a layer of a crystalline metal oxide or crystalline metal oxynitride material upon the substrate, and a layer of an oriented cubic oxide material having a rock-salt-like structure upon the crystalline metal oxide or crystalline metal oxynitride material layer. In one embodiment, the composite substrate structure further includes a layer of an inert oxide material layer as a barrier layer between the substrate and the crystalline metal oxide or crystalline metal oxynitride material layer. In one embodiment the inert oxide material is from the group of aluminum oxide, erbium oxide, and yttrium oxide. In another embodiment, the composite substrate structure further includes at least one layer of a buffer material upon the oriented cubic oxide material layer. Such a composite substrate structure can serve as a support for a high temperature superconducting material upon a suitable buffer material layer upon the oriented cubic oxide material layer.

In another embodiment of the invention, the composite substrate structure further includes a homo-epitaxial layer of the oriented cubic oxide material having a rock-salt like structure upon the initially IBAD oriented cubic oxide material layer.

In another embodiment of the invention, the composite substrate structure includes a layer of an inert oxide material between the substrate and the layer of a crystalline metal oxide or crystalline metal oxynitride material.

In a preferred embodiment of the invention, the oriented cubic oxide material having a rock-salt-like structure is magnesium oxide.

The present invention also provides a superconducting article including a flexible polycrystalline metal substrate, a layer of a crystalline metal oxide or crystalline metal oxynitride material upon the flexible polycrystalline metal substrate, a layer of an oriented cubic oxide material having a rock-salt-like structure upon the crystalline metal oxide or crystalline metal oxynitride material layer, at least one layer of a buffer material upon the oriented cubic oxide material layer, and a top-layer of a high temperature superconducting material upon the at least one layer of a buffer material. In one embodiment, the superconducting article further includes a layer of an inert oxide material layer from the group of aluminum oxide, erbium oxide, and yttrium oxide between the flexible polycrystalline metal substrate and the crystalline metal oxide or crystalline metal oxynitride material layer. In another embodiment, the superconducting article further includes at least two differing buffer material layers as the at least one layer of buffer material upon the oriented cubic oxide material layer.

BRIEF DESCRIPTION OF THE DRAWINGS

FIG. 2 shows an illustrative structure of a superconductive article in accordance with the present invention.

DETAILED DESCRIPTION

Figure 1A:
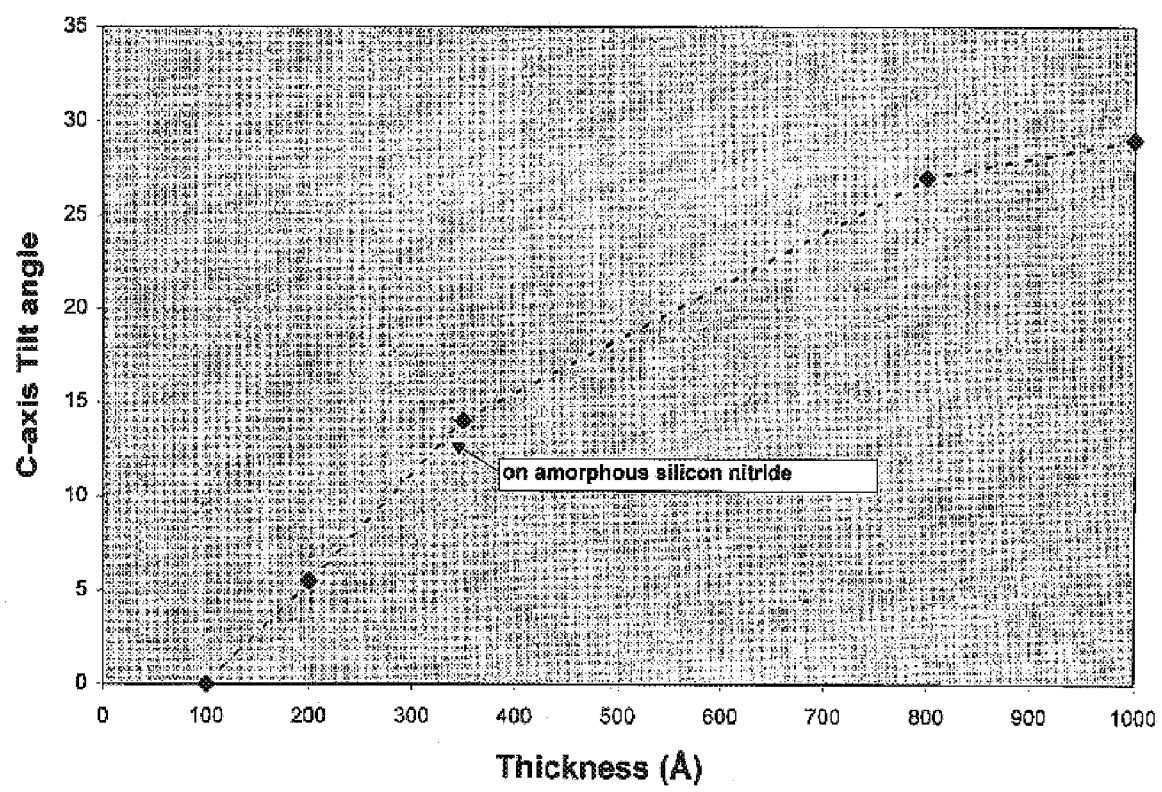
FIG. 1(a) shows a graph plotting the c-axis lattice tilt angle in degrees of tilt versus thickness of IBAD magnesium oxide upon an amorphous silicon nitride surface.

The present invention is concerned with composite substrate structures for subsequent growth of oriented layers thereon and preparation of such composite substrate structures. The present invention is further concerned with superconducting articles and their preparation. High temperature superconducting thick films can be grown epitaxially on such composite substrate structures with high $J_c$'s and $I_c$'s. Such high temperature superconducting thick films can be in the form of wires or tapes.

In the present invention, an initial or base substrate can be, e.g., any polycrystalline material such as polycrystalline metals or polycrystalline ceramics. In one embodiment, the substrate can be a polycrystalline metal such as metal alloys. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the substrate can be a polycrystalline ceramic such as polycrystalline aluminum oxide, polycrystalline yttria-stabilized zirconia (YSZ), forsterite, yttrium-iron-garnet (YIG), silica and the like.

The ultimate application can determine the selection of the material for the base substrate. For example, the base substrate on which any subsequent superconducting material is deposited should preferably allow for the resultant article to be flexible whereby superconducting articles (e.g., coils, motors or magnets) can be shaped. Thus, for superconducting applications requiring flexible substrates, the base substrate is a polycrystalline metal as these materials are generally flexible, i.e., they can be shaped. For other applications, the base substrate on which other oriented materials are deposited may be polycrystalline ceramics, either flexible or non-flexible.

As polycrystalline metal substrates can have a rough surface, such surfaces can be mechanically polished, electrochemically polished or chemically mechanically polished to provide a smoother surface. Initially, polycrystalline metal substrates often have rough surfaces with, e.g., a root mean square (RMS) roughness of 15 nm to 100 nm or greater. (Note: For measuring roughness, all scans are done using scanning force microscopy and are over a 5×5 $\mu$m area.) In one embodiment, the polycrystalline metal substrates are provided with a smooth surface via electrochemical polishing. By "smooth" is meant a surface having a root mean square (RMS) roughness of less than about 2 nm, preferably less than about 1 nm. To obtain the desired smoothness, it can be preferred to treat the polycrystalline metal substrate by electrochemical polishing. In one embodiment of electrochemical polishing, a metallic tape having an initial RMS roughness of more than about 10 nm can be passed through an acid bath (a highly concentrated phosphoric and sulphuric acid bath available as EPS 400 from Electro Polish Systems, Inc., Brown Deer, Wis.) while a current density of at least 0.18 amperes per square centimeter is passed through the metallic tape whereby the RMS roughness can be reduced to less than 1 nm.

Figure 6:
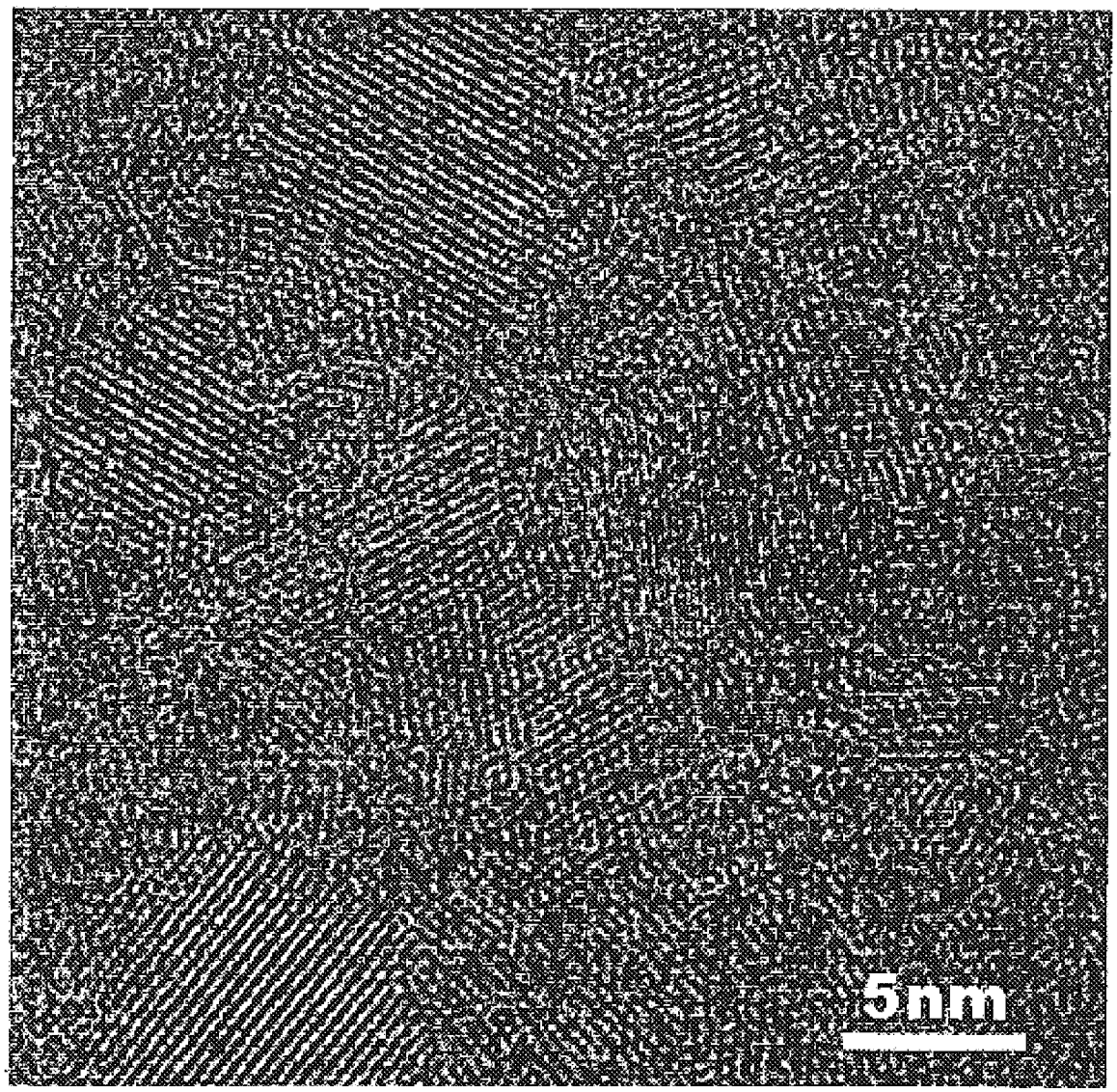
FIG. 6 shows a digital representation of a high-resolution transmission electron micrograph of a yttrium oxide layer in accordance with the present invention.

In one embodiment of the present invention, a layer of a crystalline metal oxide or crystalline metal oxynitride material is deposited upon the base substrate. By "crystalline" is meant that the atoms of the material have order over various length scales of longer than a few nanometers. By "order" is meant that the atoms have a definite pattern referred to as a lattice structure. FIG. 6 shows a digital representation of a high resolution transmission electron micrograph of a yttrium oxide layer in accordance with the present invention wherein the yttrium oxide layer exhibits a crystalline structure.

Figure 1B:
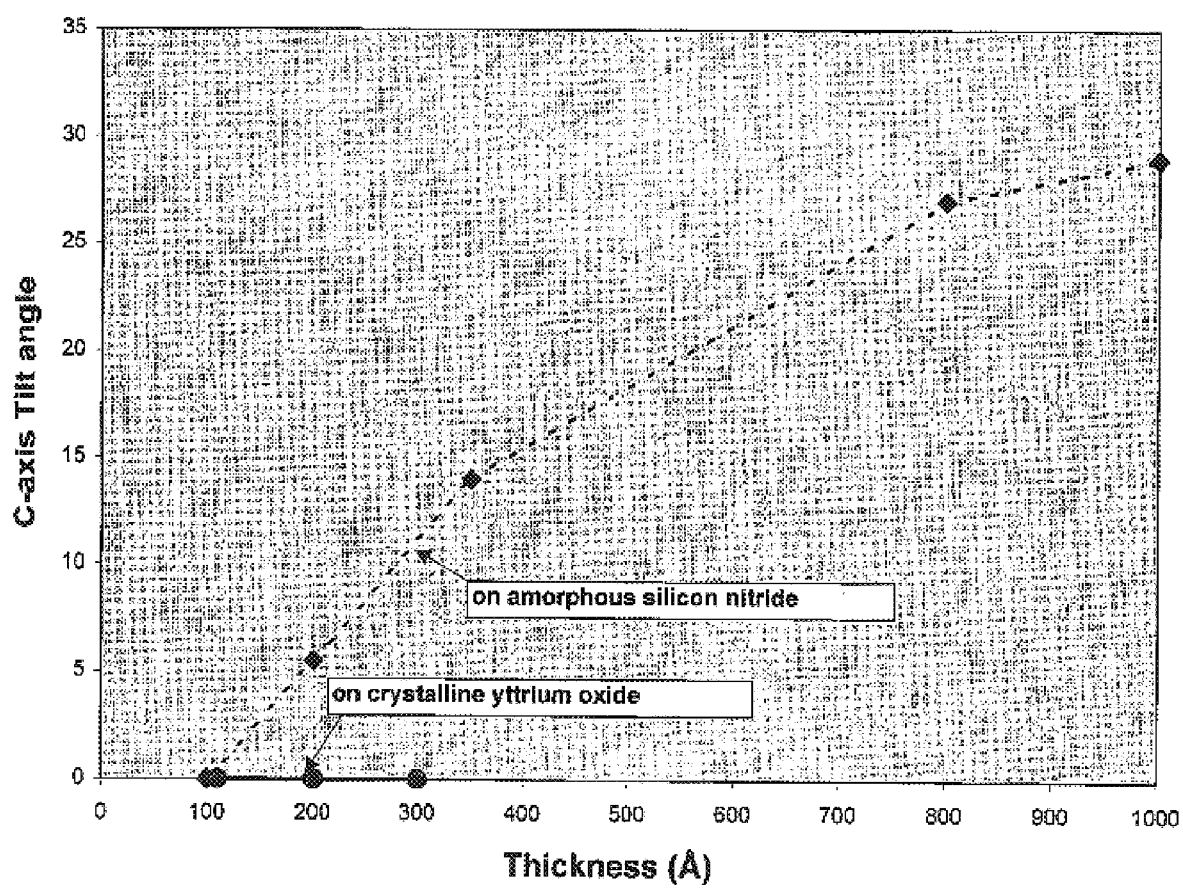
FIG. 1(b) shows a graph comparing plots of the c-axis lattice tilt angle in degrees of tilt versus thickness of IBAD magnesium oxide upon an amorphous silicon nitride surface and a crystalline yttrium oxide surface.
Figure 3:
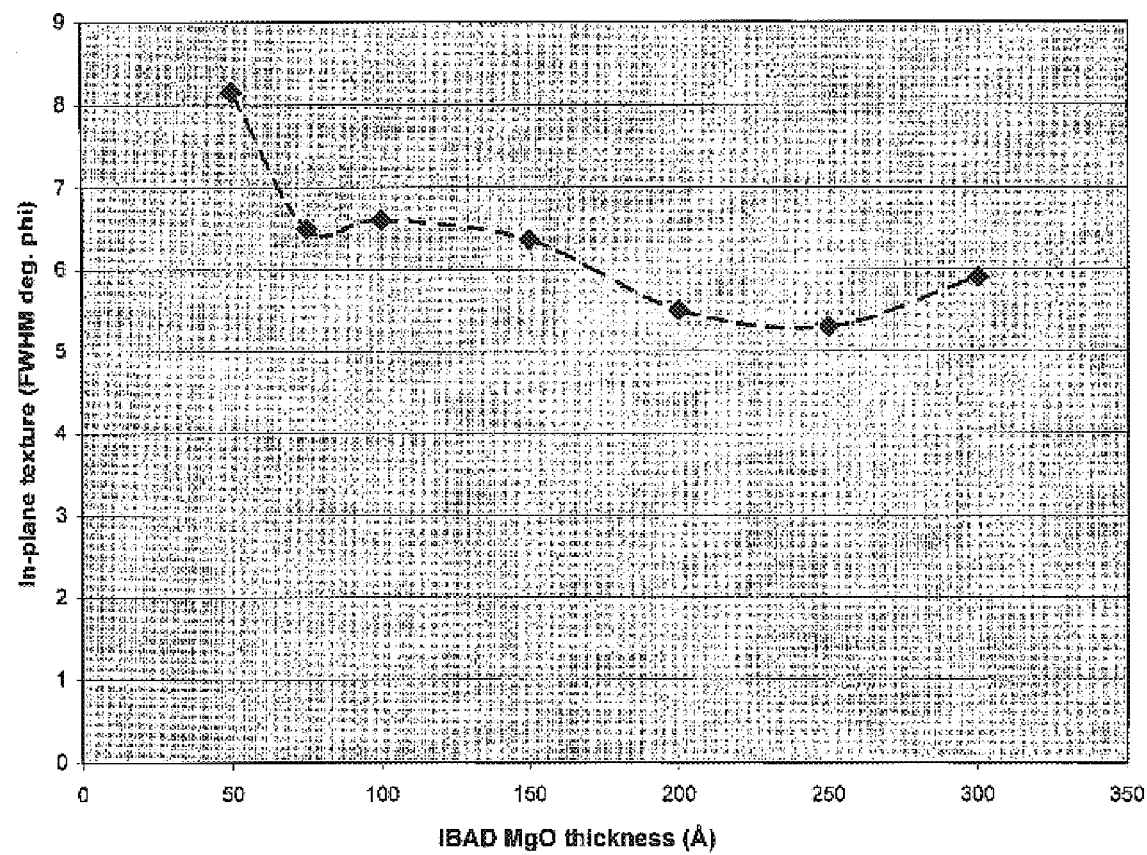
FIG. 3 shows a graph plotting the in-plane texture versus thickness of IBAD magnesium oxide upon a crystalline yttrium oxide surface.
Figure 4:
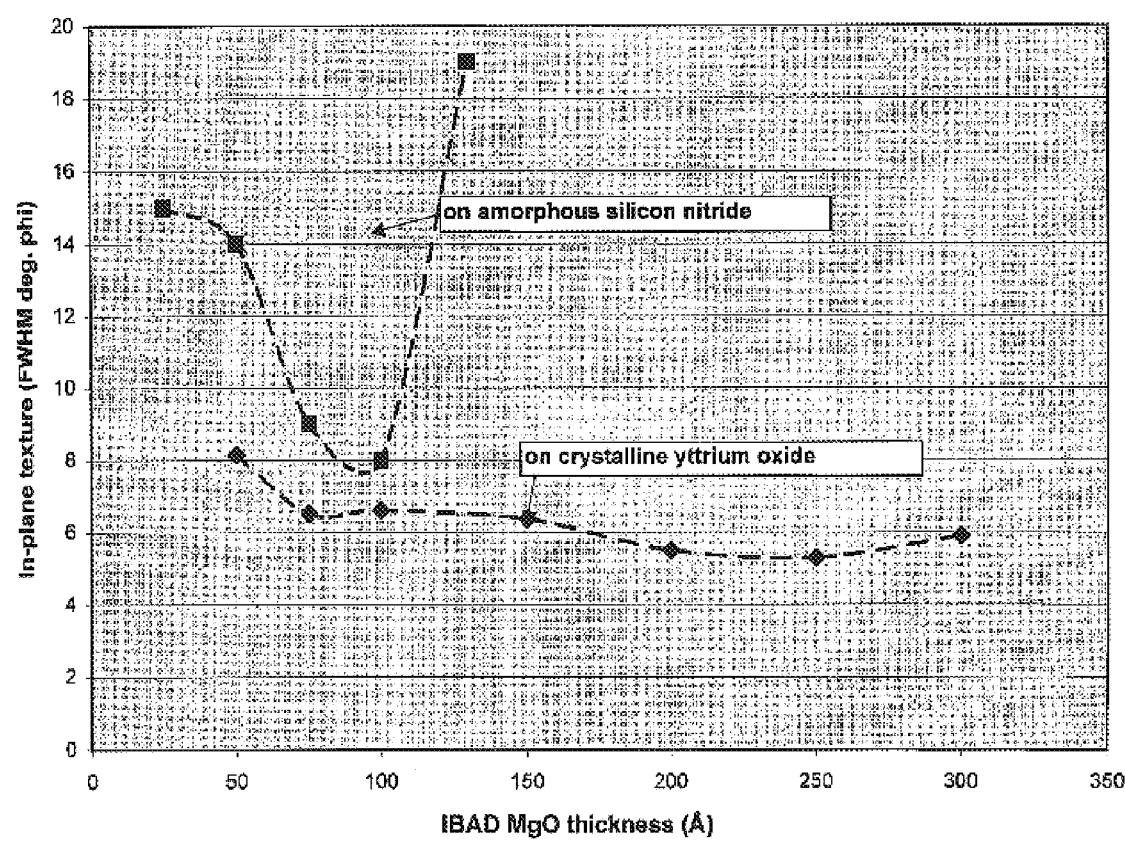
FIG. 4 shows a graph comparing plots of in-plane texture versus IBAD magnesium oxide thickness for both (a) IBAD magnesium oxide on an amorphous silicon nitride layer and (b) IBAD magnesium oxide on a crystalline yttrium oxide layer.

The crystalline metal oxide or crystalline metal oxynitride material layer can serve as a nucleation layer for growth of an oriented layer by IBAD. In contrast to the gradual tilting of an IBAD MgO layer with increasing thickness upon amorphous silicon nitride surfaces (see FIG. 1(a)), the use of crystalline metal oxide or crystalline metal oxynitride material layer allows for thicker IBAD MgO layers without such detrimental tilting (see FIG. 1(b)). The crystalline metal oxide or crystalline metal oxynitride material layer can be deposited on the base substrate by pulsed laser deposition, e-beam evaporation, sputtering or by any other suitable means. The crystalline metal oxide or crystalline metal oxynitride material layer is generally deposited at temperatures of generally about 100° C. The crystalline metal oxide or crystalline metal oxynitride material layer is typically from about 50 angstroms to about 1000 angstroms in thickness, preferably from about 50 angstroms to about 200 angstroms. Among the metal oxide or metal oxynitride materials suitable as the crystalline layer are included yttrium oxide ($Y_2O_3$), aluminum oxynitride (AlON), erbium oxide ($Er_2O_3$), yttria-stabilized zirconia (YSZ), cerium oxide ($CeO_2$), europium oxide, nickel aluminate spinel ($NiAl_2O_4$), and barium zirconate ($BaZrO_3$). Preferably, the crystalline layer of metal oxide or metal oxynitride material is yttrium oxide, aluminum oxynitride, erbium oxide or yttria-stabilized zirconia and more preferably is yttrium oxide or erbium oxide.

Optionally, in some instances where a base substrate, e.g., a polycrystalline metal substrate, is not polished, the desired smoothness for subsequent depositions can be provided by a first coating layer, i.e., an inert oxide material layer, upon the base substrate which is polished thereafter. Such an inert oxide material layer can also serve as a barrier layer to reduce or eliminate migration of ions from the base substrate, particularly from polycrystalline metal substrates, to other layers.

By "inert" is meant that this oxide material does not react, or has negligible reaction, with the base substrate or with any subsequently deposited materials. Examples of suitable inert oxide materials include aluminum oxide ($Al_2O_3$), erbium oxide ($Er_2O_3$), yttrium oxide ($Y_2O_3$), and yttria-stabilized zirconia (YSZ). The preferred inert oxide material is aluminum oxide. Such an inert oxide layer can be deposited on the base substrate by pulsed laser deposition, e-beam evaporation, sputtering or by any other suitable means. The layer is generally deposited at about room temperature. When the base substrate is metallic, it often has a rough surface with, e.g., a RMS of 15 nm to 100 nm or greater. Generally, where an inert oxide layer is employed upon the base substrate, the inert oxide layer has a thickness of from about 100 angstroms to about 1000 angstroms depending upon the roughness of the base substrate. Thicker coating layers of the inert oxide material are used for rougher base substrate surfaces. In some instances, the inert oxide layer can serve to provide a smooth surface for subsequent depositions as well as serve as a barrier layer. By "smooth" is meant a surface having a root mean square (RMS) roughness of less than about 2 nm, preferably less than about 1 nm. To obtain the desired smoothness, it can be preferred to treat the deposited inert oxide layer by chemical mechanical polishing. For the very best surface finishes, i.e., a RMS roughness of less than about 1 nm, after overcoating the smooth or polished polycrystalline metal alloy with an inert oxide layer, a short (e.g., about 5 seconds) CMP step can be conducted on the inert oxide layer. In other instances, where such an inert oxide layer is applied to an already smooth base substrate surface, the inert oxide layer can serve as a barrier layer.

In another embodiment of the invention, a single layer of erbium oxide is used as both the inert layer and the nucleation layer. With the use of erbium oxide as the crystalline layer onto which the MgO is deposited, there is generally no need to consider any other inert oxide layer upon the base substrate. Such a crystalline erbium oxide layer can be chemically mechanically polished if desired.

The crystalline surface of the metal oxide or metal oxynitride material provides an excellent nucleation layer for the subsequent deposition of a layer of an oriented cubic oxide material having a rock-salt-like structure. Such oriented cubic oxide materials can be, e.g., magnesium oxide, calcium oxide, strontium oxide, zirconium oxide, barium oxide, europium oxide, samarium oxide and other materials such as described in U.S. Pat. No. 6,190,752 by Do et al. Preferably, the layer of oriented cubic oxide material having a rock-salt-like structure is a magnesium oxide layer. Such a MgO layer is preferably deposited by electron beam evaporation with an ion beam assist. The MgO layer in the ion beam assisted deposition is typically evaporated from a crucible of magnesia. An ion-assisted, electron-beam evaporation system similar to that described by Wang et al., App. Phys. Lett., vol. 71, no. 20, pp. 2955–2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 45±3°.

The ion source gas in the ion beam assisted deposition is typically argon. The ion beam assisted deposition of MgO is conducted with substrate temperatures of generally from about 20° C. to about 100° C. The MgO layer deposited by the IBAD process is generally from about 50 angstroms to about 500 angstroms in thickness, preferably about 100 angstroms to about 200 angstroms. In some instances, it may be desired to deposit thicker layers of the MgO, i.e., layers from about 225 angstroms to about 400 angstroms in thickness and such thicker layers can be deposited by IBAD without any tilting or degrading of the deposited crystal lattice (see FIG. 1(b)).

After deposition of the oriented cubic oxide material having a rock-salt-like structure, e.g., MgO, an additional thin homo-epitaxial layer of the MgO can be optionally deposited as a buffer layer by a process such as electron beam or magnetron sputter deposition. This thin homo-epitaxial layer can generally be about 50 angstroms to 1000 angstroms, prefereably 100 angstroms to 500 angstroms in thickness. Deposition of the homo-epitaxial layer by such a process can be more readily accomplished than depositing the entire thickness by ion beam assisted deposition.

In the superconducting articles of the present invention, the high temperature superconducting (HTS) material is generally YBCO, e.g., $YBa_2Cu_3O_{7-\delta}$, $Y_2Ba_4Cu_7O_{14+x}$, or $YBa_2CU_4O_8$, although other minor variations of this basic superconducting material, such as use of other rare earth metals as a substitute for some or all of the yttrium, may also be used. A mixture of the rare earth metal europium with yttrium may be one preferred combination. Other superconducting materials such as bismuth and thallium based superconductor materials may also be employed. $YBa_2Cu_3O_{7-\delta}$ is generally preferred as the superconducting material.

A high temperature superconducting (HTS) layer, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

Multilayer architectures can be employed for the superconducting layer such as described in U.S. Pat. No. 6,383,989 by Jia et al., where individual layers of the superconducting material can be separated by a layer of an insulating material to obtain a greater total thickness of the superconducting layer with higher critical current values.

The composite substrate structure provided in accordance with the present invention includes a base substrate, a layer of a crystalline metal oxide or crystalline metal oxynitride material upon the substrate, and, a layer of an oriented cubic oxide material having a rock-salt-like structure upon the crystalline metal oxide or crystalline metal oxynitride material layer. Such a composite substrate structure is useful for subsequent deposition of epitaxial thin films. Such epitaxial thin films can be formed from a material selected from the group consisting of superconductors, including high temperature superconductors, semiconductors, photovoltaic materials, magnetic materials, ferroelectric materials, ferromagnetic materials, piezoelectric materials, insulating materials, conductive materials and precursors of superconductors or high temperature superconductors. The composite substrate structure is especially preferred for subsequent deposition of high temperature superconductor materials. Depending upon the particular epitaxial thin film material deposited upon the composite substrate structure, additional layers such as buffer layers can be employed for enhanced chemical or structural compatibility. In the case of YBCO as a high temperature superconductor, buffer layers are generally employed although they may not be required.

In another embodiment of the invention, the composite substrate structure further includes a layer of an inert oxide material upon the surface of the substrate between the substrate and the crystalline metal oxide or crystalline metal oxynitride material layer. Such an inert oxide material layer preferably has a smooth surface (RMS roughness of less than 2 nm, preferably less than about 1 nm) whether from the use of a smooth base substrate or from smoothing of the inert oxide material layer.

In a further embodiment of the present invention, one or more buffer layers are deposited onto the MgO layer so that they are between the MgO layer deposited by the IBAD process and any subsequent oriented material, e.g., a high temperature superconducting layer such as YBCO. These one or more buffer layers can serve both as buffer layers between the MgO layer and subsequently deposited materials, e.g., YBCO, and for assistance in lattice matching. Such so-called "buffer layers" should have good "structural compatibility" between the MgO or other oriented cubic oxide material deposited in the IBAD process and subsequently deposited materials, e.g., YBCO, and should have good chemical compatibility with both adjacent layers. By "chemical compatibility" is meant that the intermediate (buffer) layer does not undergo property degrading chemical interactions, or has minimal interactions if at all, with the adjacent layers. By "structural compatibility" is meant that the intermediate (buffer) layer has a substantially similar lattice structure with the subsequently deposited material, e.g., superconductive material. Among the materials suitable as one or more intermediate (buffer) layers are cerium oxide, yttria-stabilized zirconia, strontium titanate ($SrTiO_3$), strontium ruthenate ($SrRuO_3$), mixtures of strontium titanate and strontium ruthenate (e.g., 50/50 molar mixtures—$Sr_{1-x}Ru_xTiO_3$ where x is 0.5), lanthanum manganate ($LaMnO_3$), yttrium oxide, europium copper oxide ($Eu_2CuO_4$), neodymium copper oxide ($Nd_2CuO_4$), yttrium copper oxide ($Y_2CuO_4$), and other rare earth copper oxides ($RE_2CuO_4$) or rare earth oxides and other cubic oxide materials such as those described in U.S. Pat. No. 5,262,394, by Wu et al. for "Superconductive Articles Including Cerium Oxide Layer" such description hereby incorporated by reference. In a preferred embodiment, the present invention includes a layer of strontium ruthenate, strontium titanate or a mixture of strontium ruthenate and strontium titanate on the MgO layer. The layer of strontium ruthenate, strontium titanate or a mixture of strontium ruthenate and strontium titanate is generally from about 200 angstroms to about 1500 angstroms in thickness, preferably from about 400 angstroms to about 600 angstroms in thickness. The intermediate or buffer layers are generally deposited at temperatures of greater than about 600° C., preferably at temperatures of from about 600° C. to about 800° C.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 500 mTorr, preferably from about 100 mTorr to about 400 mTorr, can be maintained within the deposition chamber during the deposition. Distance between the substrate and the pellet can be from about 4 centimeters (cm) to about 10 cm.

The deposition rate of the film can be varied from about 0.1 angstroms per second (Å/s) to about 200 Å/s by changing the laser repetition rate from about 0.1 hertz (Hz) to about 200 Hz. Generally, the laser beam can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

In one embodiment of a superconducting article in accordance with the present invention illustrated in FIG. 2, a nickel alloy substrate 10 is initially polished by electropolishing to a smoothness of about 1 nm and then coated with a layer of aluminum oxide 12 from about 200 angstroms to 400 angstroms in thickness deposited by sputter deposition. Then, a layer 14 of crystalline $Y_2O_3$ of from about 50 angstroms to about 300 angstroms in thickness is deposited on the aluminum oxide by physical vapor deposition. Then, a layer 16 of MgO (about 150 angstroms) is deposited on the crystalline yttrium oxide by ion beam assisted deposition. Then, a homoepitaxial layer 18 of MgO is deposited upon the IBAD-MgO layer, the homoepitaxial layer of MgO of about 300 angstroms in thickness deposited in a process such as electron beam or magnetron sputter deposition. Next, a buffer layer 20 of strontium ruthenate of about 500 angstroms in thickness is deposited on the MgO layer. Finally, a layer 22 of YBCO is deposited, e.g., by pulsed laser deposition at a thickness of, e.g., about 10,000 angstroms to 20,000 angstroms.

In another embodiment of a superconducting article in accordance with the present invention, a nickel alloy substrate is initially polished by electropolishing to a smoothness of about 1 nm. Then, a layer of crystalline $Er_2O_3$ of from about 50 angstroms to about 300 angstroms in thickness is deposited on the substrate by e-beam deposition. Then, a layer of MgO (about 150 angstroms) is deposited on the crystalline erbium oxide by ion beam assisted deposition. Then, a homoepitaxial layer of MgO is deposited upon the IBAD-MgO layer, the homoepitaxial layer of MgO of about 300 angstroms in thickness deposited in a process such as electron beam or magnetron sputter deposition. Next, a buffer layer of strontium ruthenate of about 500 angstroms in thickness is deposited on the MgO layer. Finally, a layer of YBCO is deposited, e.g., by pulsed laser deposition at a thickness of, e.g., about 10,000 angstroms to 20,000 angstroms.

The present invention is more particularly described in the following examples which are intended as illustrative only, since numerous modifications and variations will be apparent to those skilled in the art.

EXAMPLE 1

A nickel alloy substrate (Hastelloy C276) was ultrasonically cleaned in soap and water, rinsed with deionized water, rinsed with methanol and blown dry with filtered nitrogen. A layer of aluminum oxide about 350 angstroms in thickness was deposited by ion beam sputter deposition. Onto this resultant article was deposited a layer of crystalline yttrium oxide (about 70 angstroms in thickness) also by ion beam sputter deposition.

An ion-assisted, electron beam evaporation system similar to that of Wang et al., App. Phys. Lett., v. 71, no. 20, pp. 2955–2957 (1997), was used to deposit a MgO film upon a flexible metal substrate of Hastelloy C-276 or other nickel-based alloys. The ion source was manufactured by Ion Tech, Inc. (Ft. Collins, Colo.) with a source geometry of 22 cm by 2.5 cm. The substrate normal to ion-assist beam angle was 45±3°. The ion source gas was argon. The ion source gas was introduced to a background partial pressure of about $1.0 \times 10^{-6}$ Torr with a total pressure during deposition of about $1 \times 10^{-4}$ Torr. The electron gun heated the MgO source to maintain a deposition rate of about 0.15 nm/sec. The ion-assist gun voltage and current density were about 750 eV and 100 $\mu A/cm^2$ respectively.

Onto this resultant article was deposited a layer of MgO about 125 angstroms in thickness using ion beam assisted electron beam deposition with an ion assist gas of argon. Onto the IBAD-MgO layer was then deposited a layer of homoepitaxial MgO (about 300 angstroms in thickness) by magnetron sputtering. Onto the top MgO layer was deposited a layer of strontium ruthnate (SRO) about 500 angstroms in thickness by pulsed laser deposition. Finally, a layer of YBCO about 1.4 microns in thickness was then deposited on the SRO by pulsed laser deposition. The $J_c$ (at 75 K) was measured as $2.3 \times 10^6$ A/cm$^2$ using a standard four-point measurement. The projected $I_c$ is 320 Amperes across a sample 1 cm wide.

Figure 5:
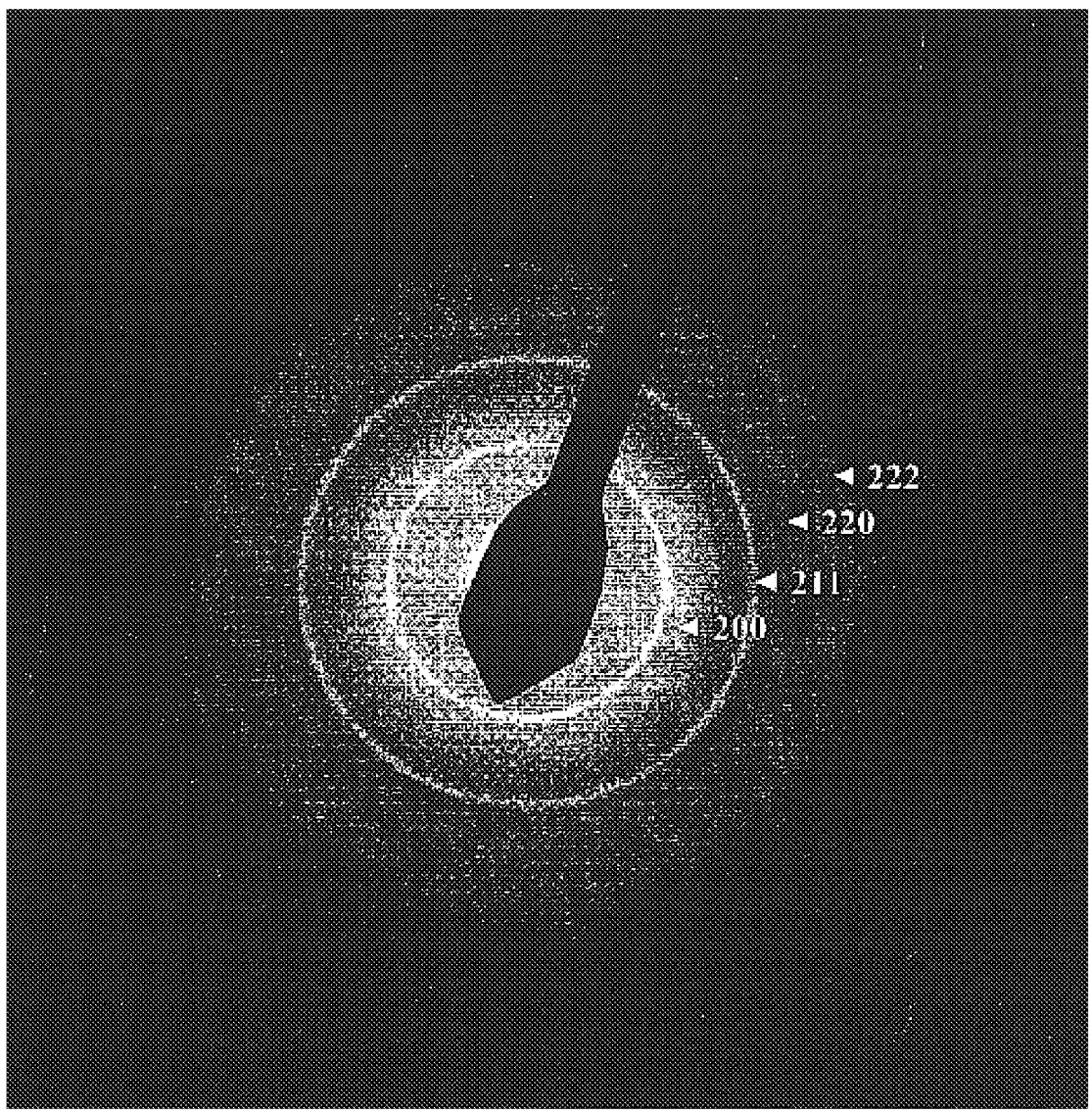
FIG. 5 shows a digital representation of a selected area diffraction pattern from a transmission electron micrograph analysis of a yttrium oxide layer in accordance with the present invention

As corroborating evidence on the structure of the yttrium oxide layer a thin yttria film (~10 nm) was deposited onto a thin amorphous silicon nitride window (~25 nm) and was directly used for transmission electron microscopy (TEM) analysis without any artifacts introduced by TEM sample preparation. This thin yttria film was grown by electron beam evaporation. FIG. 5 shows a selected area diffraction (SAD) pattern from this TEM analysis. The innermost bright ring is caused by the beam transmitting through the amorphous $Si_3N_4$ substrate. The relatively fainter outer rings confirm that the yttria film is crystalline in nature. The four outer diffraction rings, marked by arrows, are indexed as yttria (200), (211), (220) and (222). These are specific crystallographic orientations to which they correspond. Plan-view bright field, dark field and high-resolution TEM were also conducted to study the crystalline structure of this film. FIG. 6 is a high-resolution TEM image from this plan-view yttria sample. It is clear that yttria size grains are randomly oriented through out the whole sample. The average grain size of these is approximately 5 nm.

EXAMPLE 2

Another run similar to example 2 was conducted with the differences that a layer of crystalline erbium oxide (about 100 angstroms in thickness) deposited by e-beam evaporation was used in place of the yttrium oxide and the YBCO layer was about 1.6 microns in thickness. The $J_c$ was measured as $1.1 \times 10^6$ A/cm$^2$ using a standard four-point measurement. The projected $I_c$ is 175 Amperes across a sample 1 cm wide.

EXAMPLE 3

Another run similar to example 3 was conducted with the differences that no aluminum oxide layer was used between the metal substrate and the erbium oxide layer and the YBCO layer was about 1.3 microns in thickness. The $J_c$ was measured as $0.28 \times 10^6$ A/cm$^2$ using a standard four-point measurement.

The results of the present examples demonstrate that the successful use of crystalline metal oxide materials as the layer onto which an oriented layer of MgO or another oriented cubic oxide material having a rock-salt-like structure is deposited.

Although the present invention has been described with reference to specific details, it is not intended that such details should be regarded as limitations upon the scope of the invention, except as and to the extent that they are included in the accompanying claims.

What is claimed is:

1. A composite substrate structure for growth of oriented layers thereon comprising:

a substrate;

a layer of a crystalline metal oxide or crystalline metal oxynitride material upon the substrate; and, a layer of an oriented cubic oxide material having a rock-salt-like structure upon the crystalline metal oxide or crystalline metal oxynitride material layer.

2. The composite substrate structure of claim 1 wherein the layer of an oriented cubic oxide material having a rock-salt-like structure is deposited by ion beam assisted deposition.

3. The composite substrate structure of claim 1 wherein the substrate is characterized as having a RMS roughness of less than about 2 nm.

4. The composite substrate structure of claim 1 further including at least one layer of a buffer material upon the oriented cubic oxide material layer.

5. The composite substrate structure of claim 2 further including a layer of homoepitaxial oriented cubic oxide material having a rock-salt-like structure upon the ion beam assisted deposited cubic oxide material layer.

6. The composite substrate structure of claim 1 further including a layer of strontium ruthenate, strontium titanate or a mixture of strontium titanate and strontium ruthenate upon the oriented cubic oxide material layer.

7. The composite substrate structure of claim 5 further including a layer of strontium ruthenate, strontium titanate or a mixture of strontium titanate and strontium ruthenate upon the homoepitaxial oriented cubic oxide material layer.

8. The composite substrate structure of claim 1 wherein the substrate is a flexible polycrystalline metal.

9. The composite substrate structure of claim 4 wherein the at least one layer of a buffer material includes a layer of a first buffer material upon the oriented cubic oxide material layer and a layer of a second buffer material upon the first buffer material layer.

10. The composite substrate structure of claim 6 further including a second buffer material layer.

11. The composite substrate structure of claim 8 further including at least one layer of a buffer material upon the oriented cubic oxide material layer.

12. The composite substrate structure of claim 1 wherein the layer of an oriented cubic oxide material is magnesium oxide.

13. The composite substrate structure of claim 1 wherein the crystalline metal oxide or crystalline metal oxynitride material layer is a material selected from the group consisting of yttrium oxide, aluminum oxynitride, erbium oxide, yttria-stabilized zirconia, cerium oxide and europium oxide.

14. The composite substrate structure of claim 1 further including a layer of an inert oxide material layer as a barrier layer between said substrate and said crystalline metal oxide or crystalline metal oxynitride material layer.

15. The composite substrate structure of claim 11 wherein the oriented cubic oxide material layer is magnesium oxide.

16. The composite substrate structure of claim 9 wherein second buffer material layer is a material selected from the group consisting of cerium oxide, yttrium oxide, europium copper oxide, neodymium copper oxide, yttrium copper oxide, other rare earth oxides and other rare earth copper oxides.

17. A superconducting article comprising:
a flexible polycrystalline metallic substrate;
a layer of a crystalline metal oxide or crystalline metal oxynitride material upon the surface of the substrate;
a layer of an oriented cubic oxide material having a rock-salt-like structure upon the crystalline metal oxide or crystalline metal oxynitride material layer;
at least one layer of a buffer material upon the oriented cubic oxide material layer; and,
a top-layer of a high temperature superconducting material upon the at least one layer of a buffer material.

18. The composite substrate structure of claim 17 wherein the layer of an oriented cubic oxide material having a rock-salt-like structure is deposited by ion beam assisted deposition.

19. The superconducting article of claim 17 wherein the flexible polycrystalline metallic substrate is characterized as having a RMS roughness of less than about 2 nm.

20. The superconducting article of claim 18 wherein the high temperature superconducting material is YBCO.

21. The superconducting article of claim 18 wherein the at least one layer of a buffer material includes a layer of a first buffer material upon the oriented cubic oxide material layer and a layer of a second buffer material upon the first buffer material layer.

22. The superconducting article of claim 21 wherein said first buffer layer is a homo-epitaxial oriented cubic oxide material layer having a rock-salt-like structure and said second buffer material layer is a layer of strontium ruthenate, strontium titanate or a mixture of strontium titanate and strontium ruthenate.

23. The superconducting article of claim 18 further including a layer of strontium ruthenate, strontium titanate or a mixture of strontium titanate and strontium ruthenate upon the oriented cubic oxide material layer.

24. The superconducting article of claim 18 further including a layer of an inert oxide material layer as a barrier layer between said flexible polycrystalline metallic substrate and said crystalline metal oxide or crystalline metal oxynitride material layer.

25. The superconducting article of claim 17 wherein the crystalline metal oxide material layer is erbium oxide.

26. The superconducting article of claim 17 wherein the oriented cubic oxide material layer is magnesium oxide.

27. The superconducting article of claim 22 wherein the oriented cubic oxide material layer is magnesium oxide.

* * * * *